United States Patent [19]

Kim et al.

[11] Patent Number: 5,077,232
[45] Date of Patent: Dec. 31, 1991

[54] METHOD OF MAKING STACKED CAPACITOR DRAM CELLS

[75] Inventors: Seong-Tae Kim, Seoul; Su-Han Choi, Suwon, both of Rep. of Korea

[73] Assignee: Samsung Electronics Co., Ltd., Suwon, Rep. of Korea

[21] Appl. No.: 489,824

[22] Filed: Mar. 9, 1990

[51] Int. Cl.$^5$ .............................................. H01L 21/70
[52] U.S. Cl. .................................. 437/52; 437/47; 437/48; 437/60
[58] Field of Search ....................... 437/38, 47, 48, 51, 437/52, 60, 225, 203, 228, 233, 235, 919; 357/23.6, 51

[56] References Cited

U.S. PATENT DOCUMENTS

| 4,545,852 | 10/1985 | Barton | 437/228 |
| 4,645,564 | 2/1987 | Morie et al. | 357/51 |
| 4,741,802 | 5/1988 | Okumura | 357/23.6 |
| 4,775,550 | 10/1988 | Chu et al. | 437/228 |
| 4,797,719 | 1/1989 | Ueda | 357/23.6 |
| 4,877,750 | 10/1989 | Okumura | 357/23.6 |
| 4,894,696 | 1/1990 | Takeda et al. | 357/23.6 |
| 4,951,175 | 8/1990 | Kurosawa et al. | 357/23.6 |

FOREIGN PATENT DOCUMENTS

| 00884053 | 4/1986 | Japan | 357/23.6 |
| 0266865 | 11/1987 | Japan | 357/23.6 |
| 0293667 | 12/1987 | Japan | 357/23.6 |
| 0018253 | 1/1989 | Japan | 357/23.6 |

Primary Examiner—Brian E. Hearn
Assistant Examiner—Tom Thomas
Attorney, Agent, or Firm—Cushman, Darby & Cushman

[57] ABSTRACT

A method for manufacturing a combined stack-trench type capacitor includes forming a trench in the semiconductor substrate. A conductive layer, used as a first electrode, a dielectric film and another conductive layer, used as a second electrode, are deposited successively and continuously in the trench. The two conductive layers and the sandwiched dielectric film are then etched to form a capacitor pattern. An insulating layer is formed along the edges of the capacitor pattern, and then a third conductive layer is formed over the entire structure.

7 Claims, 8 Drawing Sheets

METHOD OF MAKING STACKED CAPACITOR DRAM CELLS

BACKGROUND OF THE INVENTION

1. Field of the Invention

The present invention relates to a semiconductor device and a manufacturing method thereof, and particularly to a combined stacktrench.

2. Background and Related Art

As the demand and utility of memory devices escalates, it is increasingly important to develop large capacity memory devices. It also is equally important to minimize the semiconductor area required for such memory devices, thereby increasing the packing density. Considerable progress has been achieved in increasing the density of DRAM (Dynamic Random Access Memory) by producing an individual memory cell having a single capacitor and a single transistor. To further increase packing density, this memory cell has been converted from the traditional planar-type capacitor cell structure to three-dimensional stack-type and trench-type capacitor cell structures.

When manufacturing a trench-type capacitor, anisotropic etching is employed to produce thin trenches on the surface of the substrate. The resultant side walls of the trenches are utilized as the capacitor region, thereby providing large capacitance within a narrow region.

However, the conventional trench-type capacitor has several drawbacks which are likely to occur during scaling-down work including soft errors resulting from alpha particles and leakage current between the trenches.

On the other hand, a stack-type capacitor is manufactured by stacking a capacitor upon a silicon substrate. The stack-type capacitor is advantageous because soft errors are minimized due to a small diffusion region, and the manufacturing process is relatively simple. However, it is difficult to grow a dielectric film for stack-type capacitors. Further, the stack-type capacitor has a step coverage problem due to the stacked structure of the capacitor upon a transistor.

To employ three-dimensional capacitor cell structures in UVLSI memory devices on the order of sub-half-micron, a topologically high stack-type capacitor or a combined stack-trench type capacitor has been proposed. The conventional manufacturing process for the combined stack-trench type capacitor is illustrated in FIGS. 1A to 1D, and will be described below in detail.

As illustrated in FIG. 1A, an active region is defined by growing a field oxide layer 101 on a semiconductor substrate 100. A gate electrode 2, a source region 3 and a drain region 4 of a transistor, which is a part of the memory cell, are formed on the active region. A first conductive layer 5 (e.g., an impurity-doped polycrystalline silicon layer) is formed on the field oxide layer 101 such that it is connected with a gate electrode of a memory cell disposed adjacently to any predetermined portion of the field oxide layer 10;. An insulating layer 6 is then formed over the surface of the whole structure described above.

A trench 10 is etched between the field oxide layer 101 and the gate electrode 2 and through the insulating layer 6. The sharp corners of the trench 10 are then rounded off. A sacrificial oxide layer 11, having a thickness of 100Å–1000Å, is formed on both the inside of the trench and on the insulating layer 6 to minimize any damage which might have occurred during the formation of the trench 10.

As illustrated in FIG. 1B, the sacrificial oxide layer 11 is removed, and a second conductive layer 12 (e.g., an impurity-doped polycrystalline silicon layer) is formed on both the inside of the trench 10 and the insulating layer 6. The second conductive layer 12 has a thickness of 500Å–3000Å and is used as a first electrode of the capacitor. A mask or photoresist technique is then performed upon the second conductive layer 12 to form a photoresist pattern 20.

In FIG. 1C, the second conductive layer 12 is etched according to the photoresist pattern 20 to form a first electrode pattern 12a. A dielectric film 13 is then formed to cover the surface of the first electrode pattern 12a.

As illustrated in FIG. 1D, a third conductive layer 14 (e.g., an impurity-doped polycrystalline silicon layer) is formed over the entire structure. The third conductive layer 14 is used as a second electrode of the capacitor, thereby completing the conventional combined stack-trench type capacitor.

However, the conventional manufacturing method described above has drawbacks which reduce the effectiveness of the capacitor cell. Since the first electrode pattern is formed via a photoetching process, by-products (principally, polymers with carbon atoms as the main element) produced during the photoetching process adhere on the side walls of the trench, thereby causing a non-uniform formation of the dielectric film. Further, when the capacitor is completed by depositing the third conductive layer on the non-uniform dielectric film, the electrical characteristics of the capacitor are aggravated, thereby impairing the reliability of the capacitor.

SUMMARY OF THE INVENTION

Therefore, it is an object of the present invention to provide a capacitor having a combined stack-trench type structure, in which, to overcome the above described problems of the conventional techniques, a second conductive layer, a dielectric film and a third conductive layer are stacked continuously both on the inside of the trench and on the transistor to form a capacitor pattern. A fourth conductive layer is then formed on top and insulated from the second conductive layer of the capacitor pattern.

It is another object of the present invention to provide a manufacturing method which effectively manufactures the capacitor having the above mentioned structure.

In achieving the above objects, the combined stack-trench type capacitor and the method for manufacturing this capacitor is given as follows. A field oxide layer is selectively formed to define an active region upon a first conductivity type semiconductor substrate. A transistor having an electrically insulated gate electrode, a source region and a drain region are formed on the active region of the semiconductor substrate. A first conductive layer is formed on the field oxide layer and is connected with a gate electrode of the memory cell disposed adjacently to any predetermined portion of the field oxide layer. A trench is formed in the semiconductor substrate and within the source region. A first insulating layer insulates the gate electrode of the transistor and the first conductive layer. A second conductive is deposited on the inside of the trench and on the first insulating layer. A dielectric film is formed on the second conductive layer, followed by a third conductive layer. The second conductive layer, the dielectric film and the third conductive layer are formed in a successive and continuous manner and a second insulating layer is formed along the side walls thereof. Finally, a fourth conductive layer is deposited to cover both the third conductive layer and the second insulating layer.

BRIEF DESCRIPTION OF THE DRAWINGS

The above objects and other advantages of the present invention will become more apparent by describing in detail the preferred embodiment of the present invention with reference to the attached drawings in which.

DESCRIPTION OF THE PREFERRED EMBODIMENT

Figure 1A:
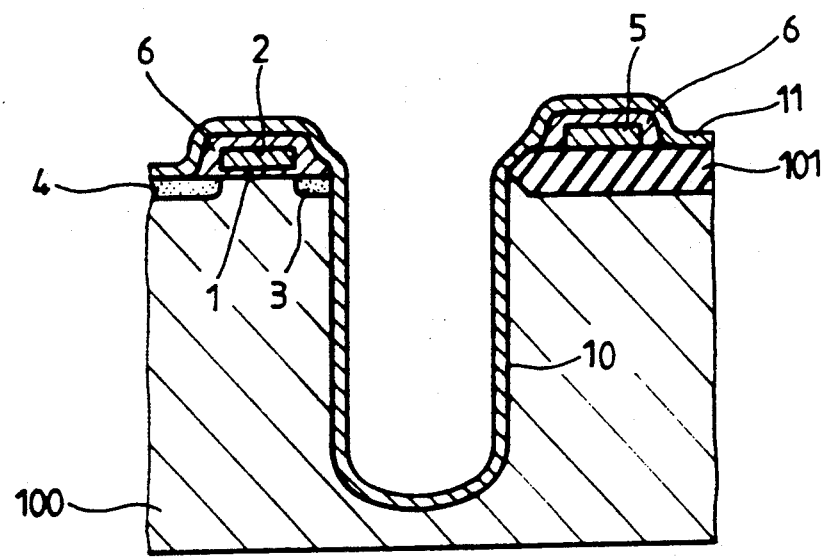
FIGS. 1A to 1D show the manufacturing processes for the conventional combined stack-trench type capacitor.
Figure 1B:
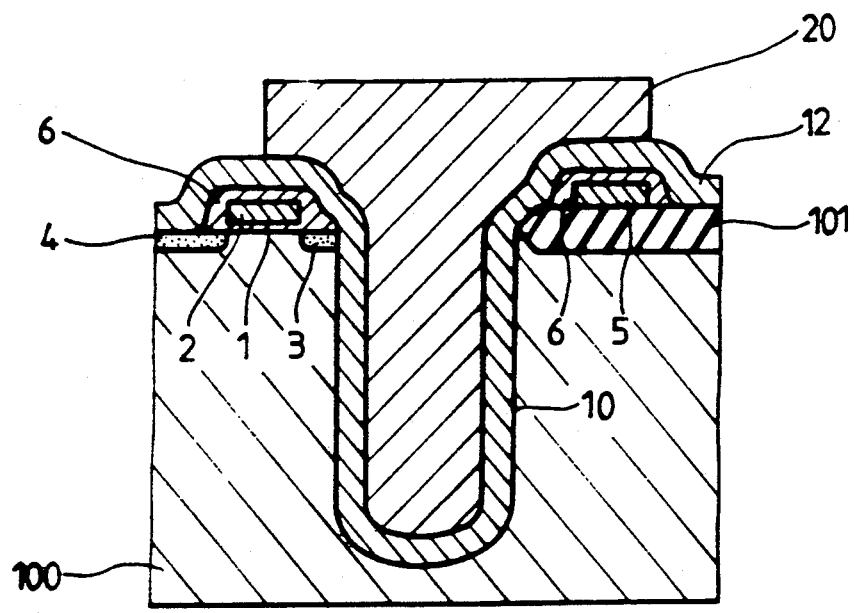
Figure 1C:
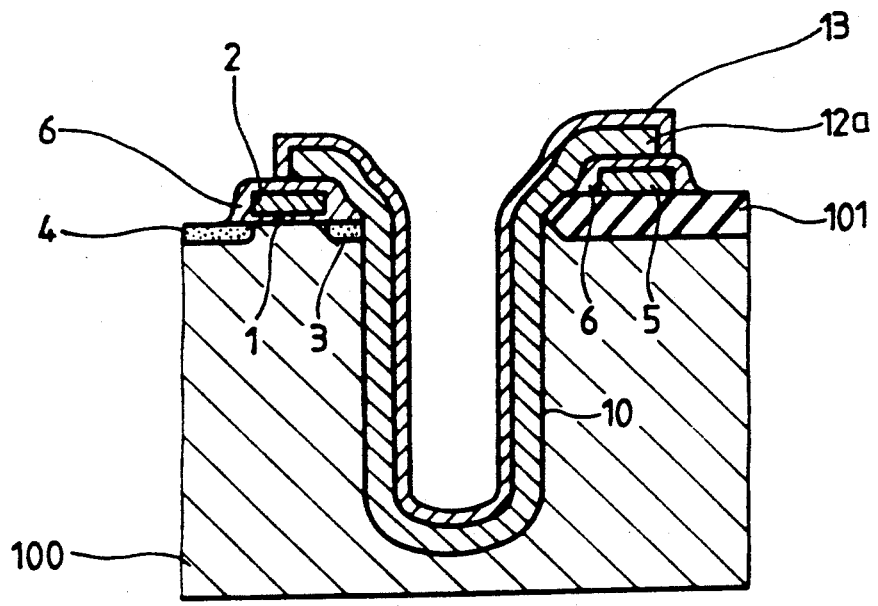
Figure 1D:
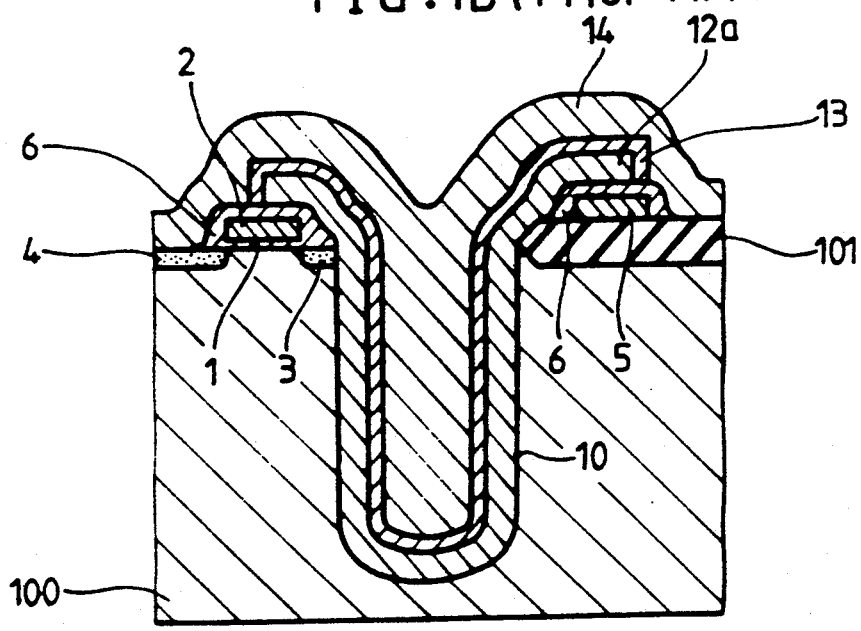
Figure 2:
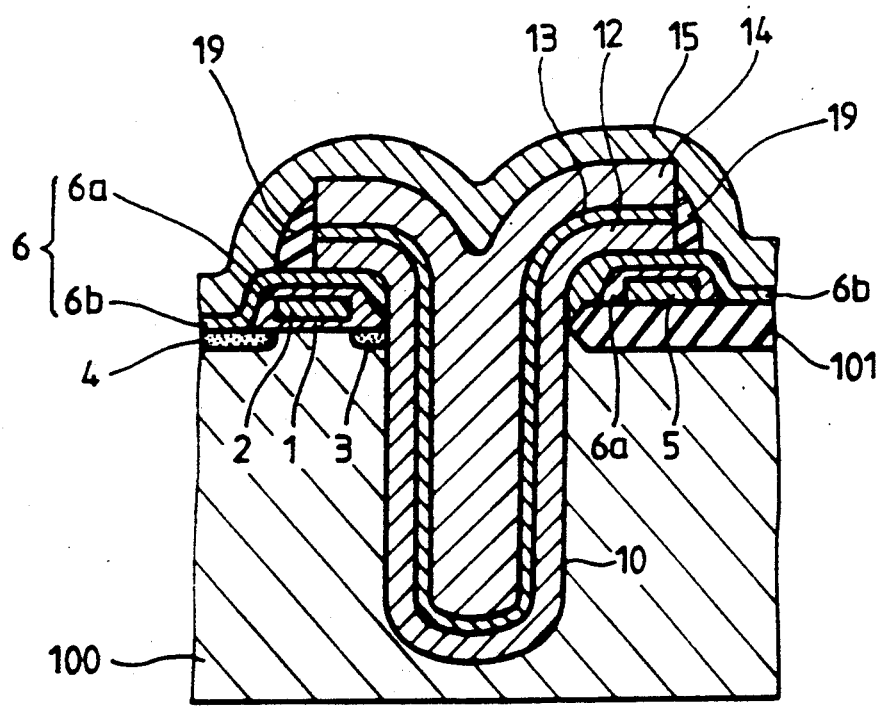
FIG. 2 shows a sectional view of the combined stack-trench type capacitor according to the present invention.

The combined stack-trench type capacitor according to the present invention shown in FIG. 2 has a field oxide layer 101 selectively formed upon a first conductivity type semiconductor substrate 100 to define an active region. A gate electrode 2 is positioned in the active region in an electrically insulated manner and is centered formed on the semiconductor substrate 100. A first between a source region 3 and a drain region 4 conductive layer 5 is formed on the field oxide layer 10; and is connected with a gate electrode of a memory cell disposed adjacent to any predetermined portion of the field oxide layer 101. A gate insulating layer 6a is formed on both the gate electrode 2 and the first conductive layer 5 and an etch blocking layer 6b covers the gate insulating layer 6a. A trench 10 is formed between the source region 3 and the field oxide layer 101. A second conductive layer 12 is formed both on the inside of the trench 10 and on a part of the etch blocking layer 6b. A dielectric film 13 is placed on the second conductive layer 12, followed by a third conductive layer 14. A second insulating layer 19 is situated along the side walls of the second conductive layer 12, the dielectric film 13 and the third conductive layer 14, and a fourth conductive layer 15 covers both the third conductive layer 14 and the second insulating layer 19.

FIGS. 3A to 3F are sectional views showing sequentially one embodiment of a method for manufacturing the combined stack-trench type capacitor according to the present invention.

Figure 3A:
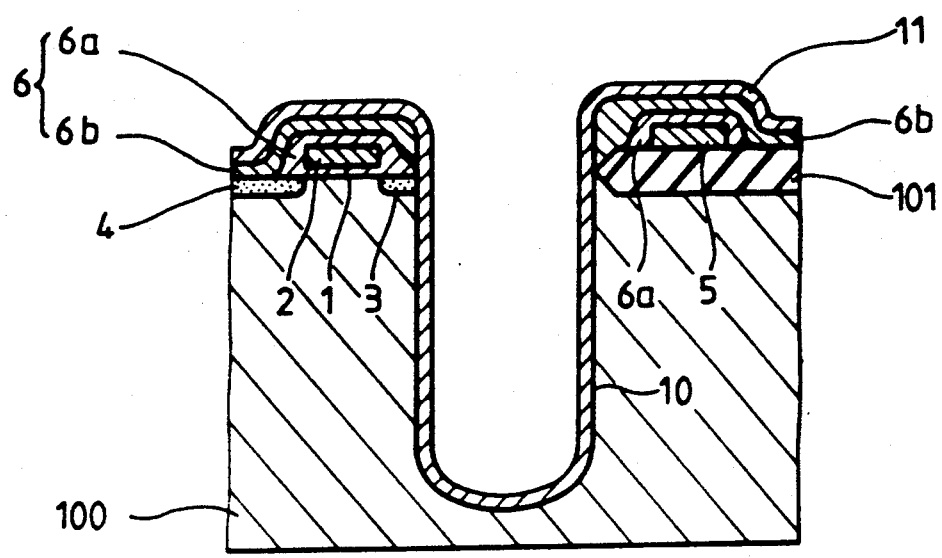
FIGS. 3A to 3F show one embodiment of the manufacturing process for the combined stack-trench type capacitor according to the present invention.

In FIG. 3A, a field oxide layer 101 is grown via a selective oxidation process on the first conductivity type semiconductor substrate 100 to define an active region. A gate oxide layer 1, having a thickness of 100Å-200Å is formed in the active region. A gate electrode 2 (e.g., an impurity-doped polycrystalline silicon layer) is then formed on the gate oxide layer 1. A first conductive layer 5 (e.g., an impurity-doped polycrystalline silicon layer) is formed on the field oxide layer 101 such that it is connected to a gate electrode (not shown) of the memory cell disposed adjacent to any predetermined portion of the field oxide layer 101. The first conductive layer 5 may be formed simultaneously with the gate electrode 2.

A source region 3 and a drain region 4 are implanted on the surface of the semiconductor substrate along respective sides of the gate electrode 2. A first insulating layer 6 is formed on the entire surface of the above described structure. The first insulating layer 6 may comprise only a gate insulating layer 6a, or a combination of a gate insulating layer 6a and an etch blocking layer 6b (as shown in FIG. 3A).

A trench 10 is etched in the semiconductor substrate by use of a mask which overlaps a part of the source region 3 and the etch blocking layer 6b. The sharp corner portions of the trench 10 are rounded off, and at the same time, a sacrificial oxide layer 11 of a thickness of 200Å-1000Å is formed both on the inside of the trench 10 and on the etch blocking layer 6b to remove the damage on the surface of the semiconductor substrate which occurred during the formation of the trench 10. The etch blocking layer 6b may be utilized as the mask to define the trench 10.

Figure 3B:
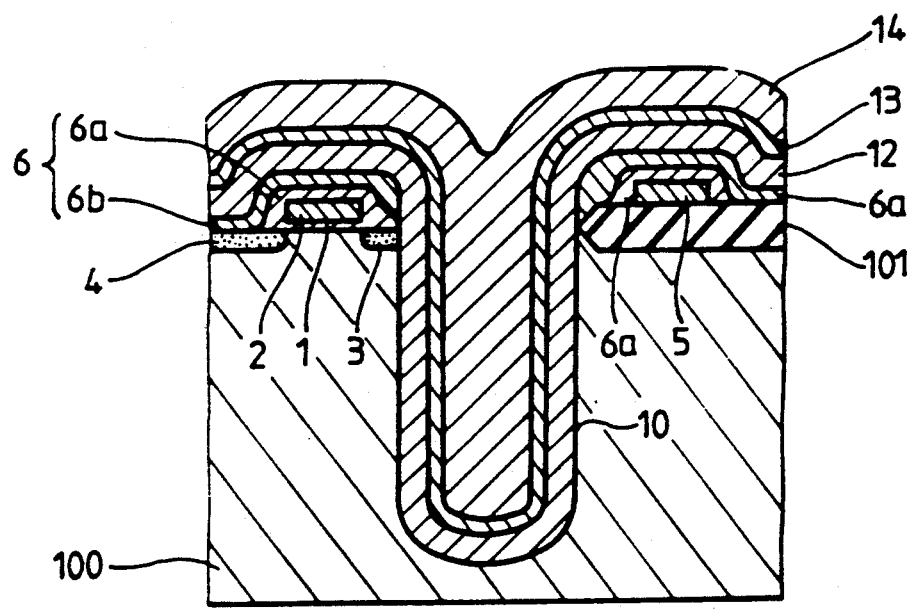

As illustrated in FIG. 3B, the sacrificial oxide layer 11 is removed, and a second conductive layer 12 (e.g., an impurity-doped polycrystalline silicone layer) having a thickness of 500Å-3000Å is formed to serve as a first electrode of the capacitor. A dielectric film 13 is then formed on the second conductive layer 12 followed by a third conductive layer 14 (e.g., an impurity-doped polycrystalline silicon layer) having a thickness of 100Å-3000Å which functions as the first layer of the second electrode of the capacitor. The second conductive layer 12, the dielectric film 13, and the third layer 14 are formed in a successive and continuous manner.

Figure 3C:
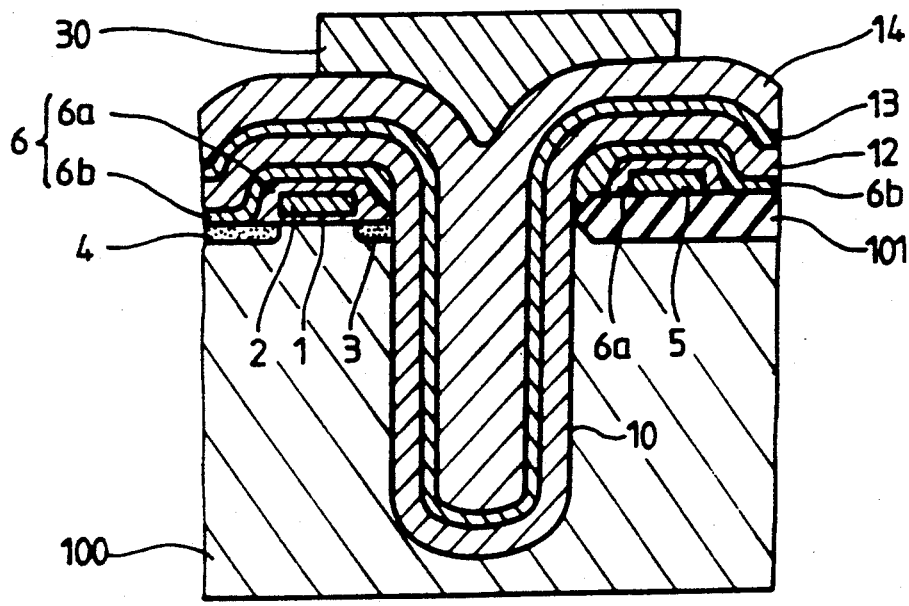

FIG. 3C illustrates a process for forming a photoresist pattern 30. A coating of photoresist is applied to the third conductive layer 14 and then exposed under a mask. The resultant photoresist pattern 30 overlaps portions of the gate electrode 2 and the first conductive layer 5.

Figure 3D:
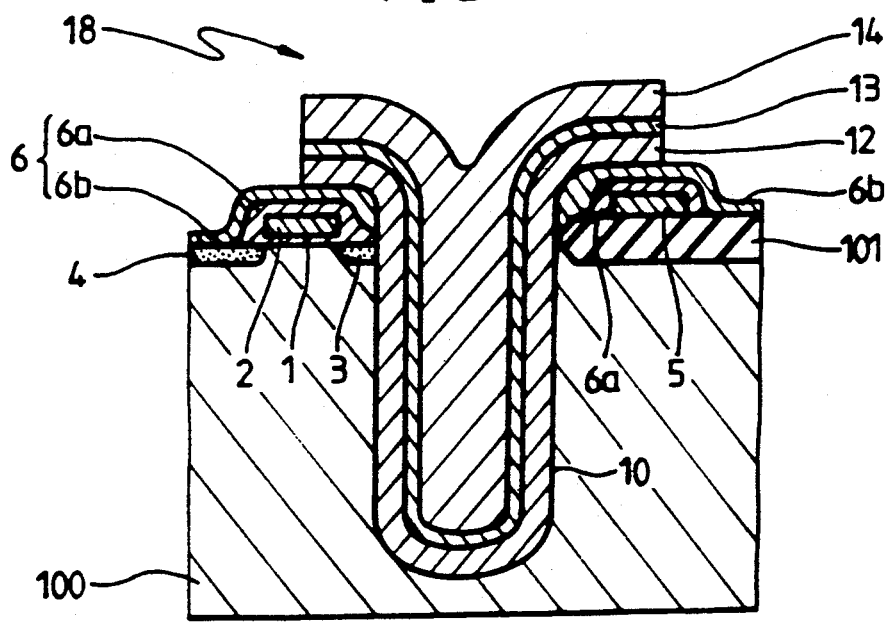

As illustrated in FIG. 3D, the structure is subjected to an etching process wherein the third conductive layer 14, the dielectric film 13 and the second conductive layer 12 are simultaneously etched to form the capacitor pattern 18. During the etching process, the gate electrode 2, the first conductive layer 5 and the field oxide layer 101 are protected by the etch blocking layer 6b (or by gate insulating layer 6a if etch blocking layer 6b is not employed).

Figure 3E:
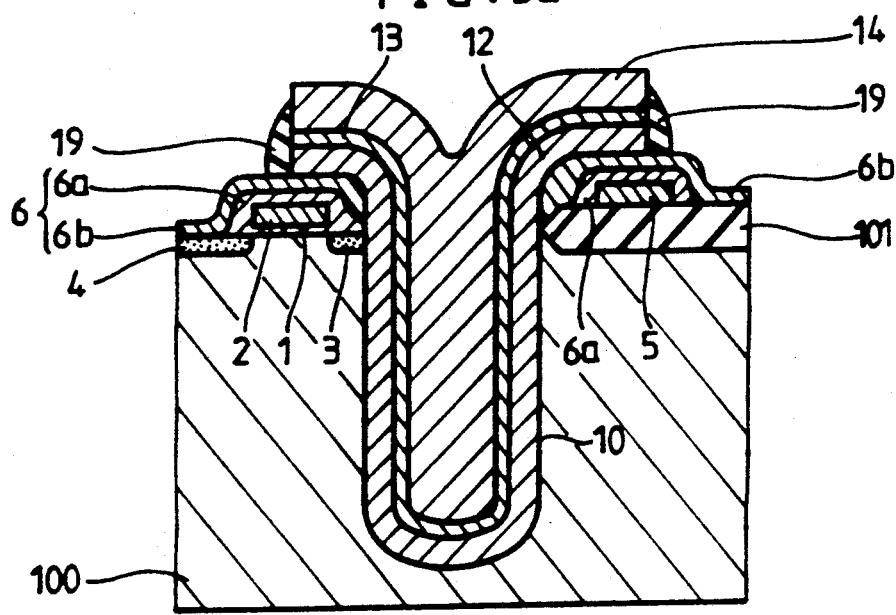

In FIG. 3E, a second insulating layer, such as an LTO (Low Temperature Oxide) layer or an HTO (High Temperature Oxide) layer, is deposited on the entire structure surface. This second insulating layer is then subjected to an etchback process to form side wall spacers 19 along the side wall of the capacitor pattern 18. The side wall spacers 19 insulate the first and second electrodes of the capacitor.

Figure 3F:
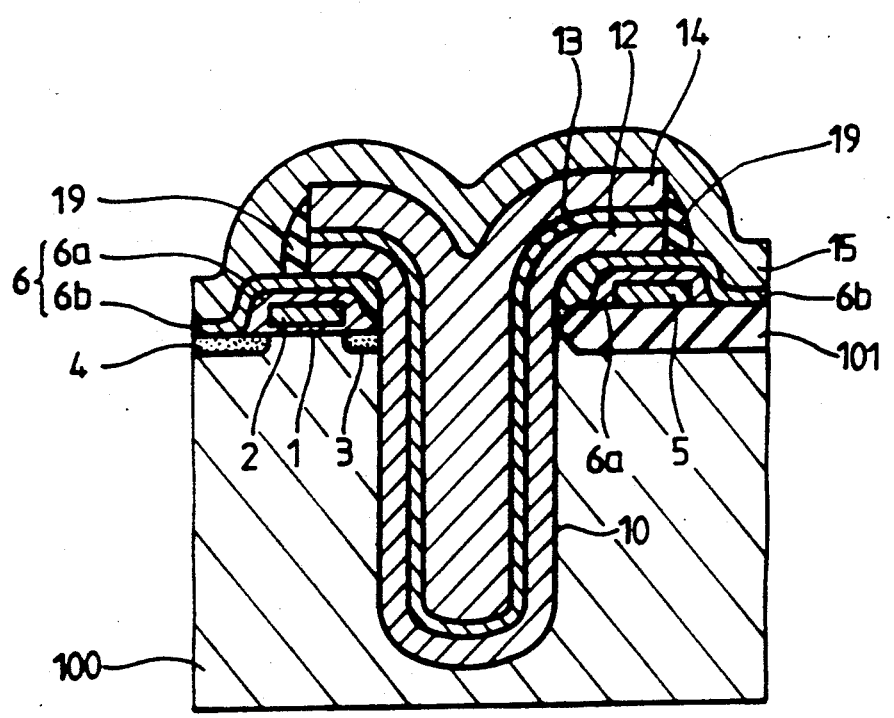

In FIG. 3F, a fourth conductive layer 15 (e.g., an impurity-doped polycrystalline silicon layer) is deposited on the structure. The fourth conductive layer 15 functions as the second layer of the second electrode of the capacitor.

FIGS. 4A to 4D illustrate another embodiment of a method for manufacturing the combined stack-trench-type capacitor according to the present invention.

Figure 4A:
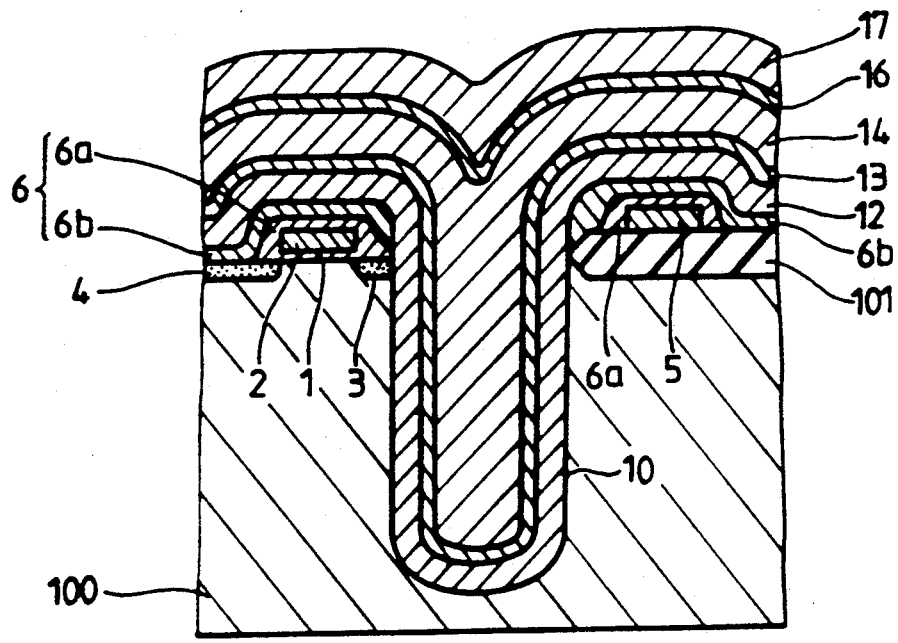
FIGS. 4A to 4D show another embodiment of the manufacturing process for the combined stack-trench type capacitor according to the present invention.
Figure 4B:
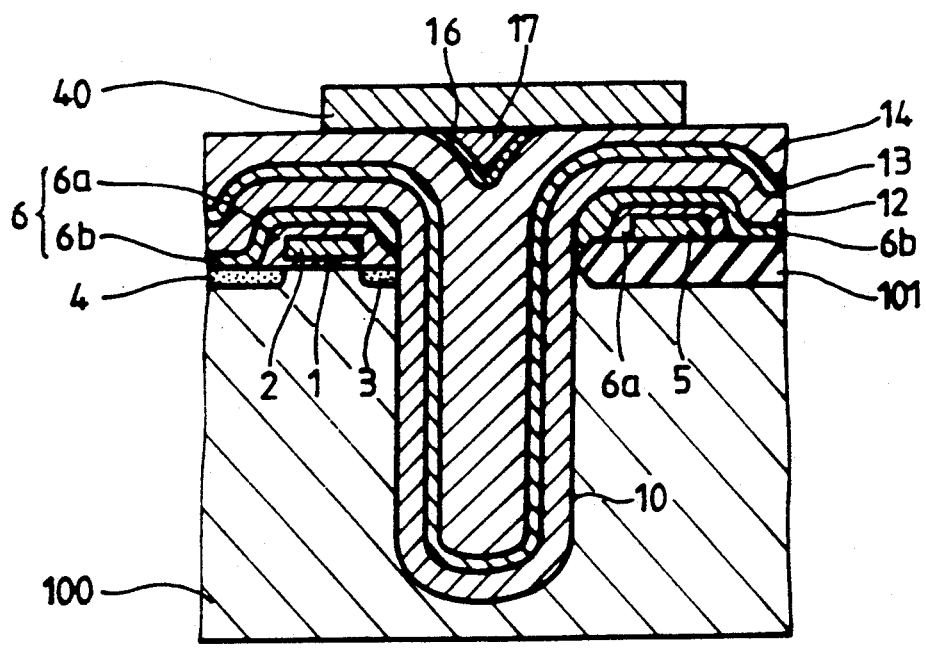

The manufacturing process preceding FIG. 4A is identical to that described in relation to FIGS. 3A and 3B and thus is omitted.

In FIG. 4A, a thin second etch blocking layer 16, comprising an LTO layer or an HTO layer, is deposited upon the third conductive layer 14. A fifth conductive layer 17 (e.g., an impurity-doped polycrystalline silicon layer) is then formed on the second etch blocking layer 16. In this manner, any possible void which would be formed in the trench 10 is prevented.

After forming the fifth conductive layer 17, an etch-back process is performed until the second etch blocking layer 16 is exposed to provide a planar surface. The second etch blocking layer 16 is then removed by a BOE (Buffered Oxide Etch) process. Thereafter, a coating of photoresist is applied to the structure, exposed under a mask and developed, to form a photoresist pattern 40 which overlaps a portion of the gate electrode 2 and a portion of the first conductive layer 5.

Figure 4C:
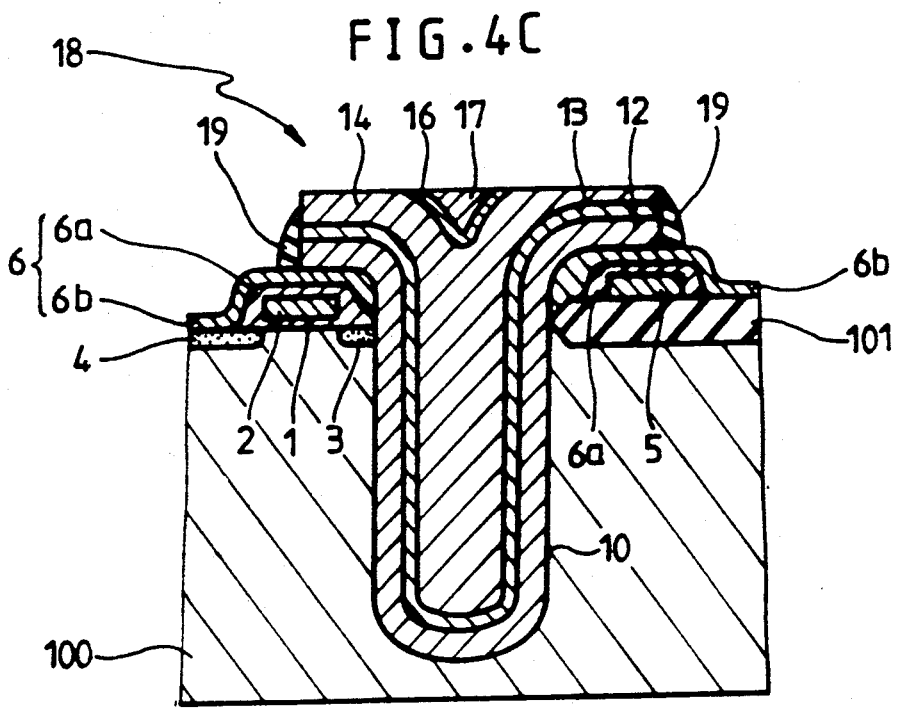
Figure 4D:
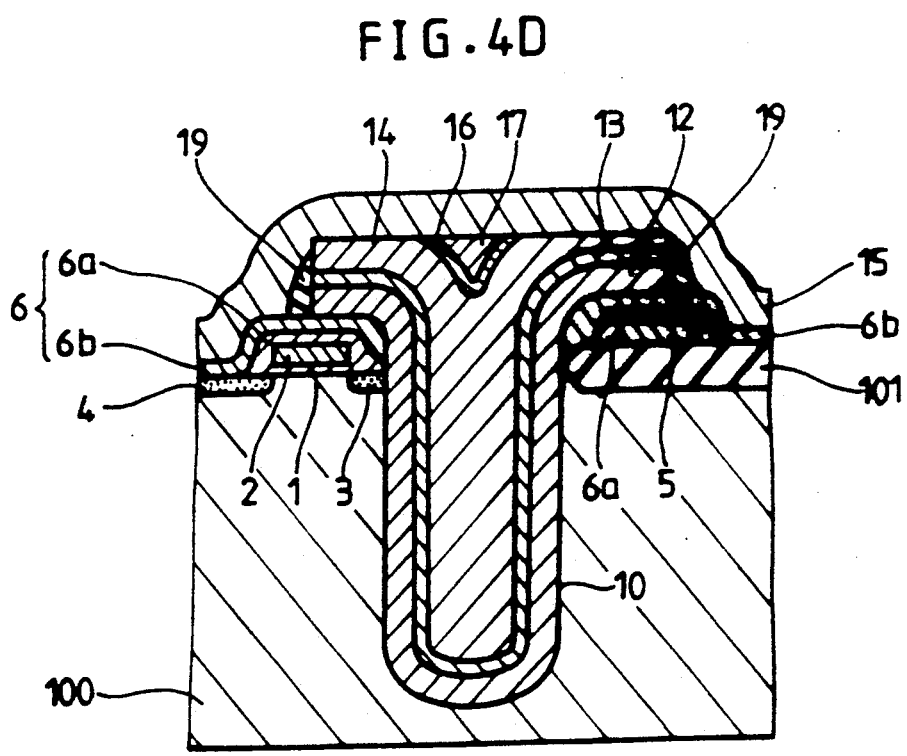

The remaining steps shown in FIGS. 4C and 4D are identical to those shown in FIGS. 3D to 3F.

In manufacturing the capacitor of the present invention, the second conductive layer used as the first electrode of the capacitor, the dielectric film, and the third conductive layer used as the first layer of the second electrode of the capacitor are successively and continuously deposited. Only after the formation of these three layers is the photoetching process applied to form the capacitor pattern. Accordingly, the dielectric film is not exposed. Therefore, unlike the conventional method, formation of by-products during the forming of the first electrode pattern is avoided, and a uniform dielectric film is obtained.

Further, the second etch blocking layer and the fifth conductive layer may be successively formed upon the third conductive layer used. According to this method, a void formed within the trench during the formation of the third conductive layer can be prevented.

According to the methods of the present invention, electrical characteristics and reliability of a combined stack-trench type capacitor may be achieved.

It is to be understood that the invention is not limited to the disclosed embodiment, but is intended to cover various modifications and equivalent arrangements included within the spirit and scope of the appended claims.

What is claimed is:

1. A method manufacturing for a semiconductor device comprising the steps of:

forming a field oxide layer upon a first conductivity type semiconductor substrate to define an active region;

forming a gate electrode, a source region and a drain region of a transistor on said active region; p1 forming a first conductive layer on a portion of said field oxide layer;

forming a trench in said semiconductor substrate, between said field oxide layer and said gate electrode;

depositing a second conductive layer, a dielectric film and a third conductive layer on the inside of said trench and said first insulation layer in a continuous manner; depositing an etch blocking a layer and fifth conductive layer respectively on said third conductive layer, and planarizing to expose said etch blocking layer.

simultaneously etching portions of said second conductive layer, said dielectric film and said third conductive layer to thereby define a capacitor pattern;

forming a second insulating layer along side walls of said capacitor pattern;

forming a fourth conductive layer over at least said third conductive region and said second insulating layer.

2. The method for manufacturing a semiconductor device as claimed in claim 1, further comprising the step of forming an etch blocking layer on said first insulating layer to define said trench.

3. The method for manufacturing a semiconductor device as claimed in claim 1, wherein said etch blocking layer comprises one of an LTO layer and an HTO layer.

4. The method for manufacturing a semiconductor device as claimed in claim 1, wherein said planarizing step is performed by an etchback process.

5. The method for manufacturing a semiconductor device as claimed in claim 1, further comprising the step of removing said etch blocking layer exposed via said planarizing step by applying a BOE process.

6. The method for manufacturing a semiconductor device as claimed in claim 1, wherein said formation of said second insulating layer is achieved by an etchback process.

7. The method for manufacturing a semiconductor device as claimed in claim 1 or 6, wherein said second insulating layer comprises one of an LTO layer and an HTO layer.

* * * * *